(12) United States Patent
Kim et al.

(10) Patent No.: US 10,825,367 B2
(45) Date of Patent: Nov. 3, 2020

(54) VOLUMETRIC TYPE THREE-DIMENSIONAL DISPLAY DEVICE

(71) Applicant: LG DISPLAY CO., LTD., Seoul (KR)

(72) Inventors: SeungHyun Kim, Seoul (KR); SungJin Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/156,204

(22) Filed: Oct. 10, 2018

(65) Prior Publication Data

US 2019/0130801 A1 May 2, 2019

(30) Foreign Application Priority Data

Oct. 31, 2017 (KR) .................. 10-2017-0144274

(51) Int. Cl.
*G09G 3/00* (2006.01)
*G09G 3/20* (2006.01)
(Continued)

(52) U.S. Cl.
CPC .............. *G09G 3/003* (2013.01); *G02B 30/52* (2020.01); *G02F 1/1334* (2013.01); *G02F 1/13439* (2013.01); *G02F 1/134309* (2013.01); *G09G 3/2003* (2013.01); *G09G 3/3208* (2013.01); *H01L 27/3211* (2013.01); *H01L 27/3232* (2013.01); *H01L 27/3267* (2013.01);
(Continued)

(58) Field of Classification Search
CPC .... G09G 3/003; G09G 3/2003; G09G 3/3208; G09G 3/36; G09G 2300/023; G09G 2300/0452; G02B 27/2271; G02B 27/22; G02F 1/1334; G02F 1/134309; H01L 51/5253; H01L 27/3276; H01L 27/3232; H01L 27/3288; H01L 51/524; H01L 27/3211

See application file for complete search history.

(56) References Cited

U.S. PATENT DOCUMENTS 5,801,666 A * 9/1998 MacFarlane ........... G02B 30/50
 345/6
5,929,572 A * 7/1999 Whitesell ............... G09G 3/003
 313/500

(Continued)

FOREIGN PATENT DOCUMENTS

CN 105247602 A 1/2016
CN 105278197 A 1/2016

(Continued)

OTHER PUBLICATIONS

Chinese Office Action dated Sep. 3, 2020 issued in corresponding Patent Application No. 2018112414190 w/ English Translation (17 pages).

*Primary Examiner* — Chad M Dicke
(74) *Attorney, Agent, or Firm* — Polsinelli PC

(57) ABSTRACT

According to an aspect of the present disclosure, provided is a volumetric type three-dimensional display device comprising a plurality of voxels having a polyhedron shape laminated three-dimensionally and a unit display panel is configured by providing a polymer dispersed liquid crystal display device on at least one surface of the polyhedron and providing an organic electroluminescent device on at least one corner of the polyhedron.

20 Claims, 15 Drawing Sheets

(51) Int. Cl.
*G02F 1/1334* (2006.01)
*G02F 1/1343* (2006.01)
*H01L 27/32* (2006.01)
*H01L 51/52* (2006.01)
*H01L 51/00* (2006.01)
*G09G 3/3208* (2016.01)
*G02B 30/52* (2020.01)
*G09G 3/36* (2006.01)

(52) U.S. Cl.
CPC ........ *H01L 51/0096* (2013.01); *H01L 51/524* (2013.01); *H01L 51/5253* (2013.01); *G02F 2201/44* (2013.01); *G02F 2203/30* (2013.01); *G09G 3/36* (2013.01); *G09G 2300/023* (2013.01); *G09G 2300/0452* (2013.01); *H01L 51/5259* (2013.01)

(56) References Cited

U.S. PATENT DOCUMENTS

| | | | | |
|---|---|---|---|---|
| 6,377,229 | B1* | 4/2002 | Sullivan | G02B 27/2278 345/6 |
| 7,587,120 | B2* | 9/2009 | Koo | H04N 13/395 385/147 |
| 9,411,552 | B2* | 8/2016 | Jepsen | G06F 3/1446 |
| 9,671,566 | B2* | 6/2017 | Abovitz | G06F 3/016 |
| 10,002,489 | B2* | 6/2018 | Collette | G07F 17/3211 |
| 10,029,422 | B2* | 7/2018 | Meisner | B29C 48/266 |
| 10,110,884 | B2* | 10/2018 | Frayne | G02B 27/2278 |
| 10,228,506 | B2* | 3/2019 | Chung | G02B 5/1819 |
| 10,236,027 | B1* | 3/2019 | Georgiou | G11B 7/127 |
| 10,284,753 | B1* | 5/2019 | Naik | H04N 5/2226 |
| 10,371,884 | B2* | 8/2019 | Ninan | G02B 6/0068 |
| 10,379,280 | B2* | 8/2019 | Chung | G02B 6/0068 |
| 10,529,138 | B2* | 1/2020 | Schowengerdt | G02B 27/0176 |
| 2002/0067444 | A1* | 6/2002 | Paolini | G02F 1/133621 349/65 |
| 2002/0163482 | A1* | 11/2002 | Sullivan | G02B 27/2278 345/6 |
| 2004/0091084 | A1* | 5/2004 | Griffith | G06T 15/08 378/210 |
| 2007/0279367 | A1* | 12/2007 | Kitai | G02F 1/13336 345/102 |
| 2012/0113096 | A1* | 5/2012 | Estrada | H04N 13/393 345/419 |
| 2012/0313508 | A1 | 12/2012 | Son et al. | |
| 2015/0193085 | A1* | 7/2015 | Talmor | G06F 3/017 345/175 |
| 2015/0242575 | A1* | 8/2015 | Abovitz | G02B 6/10 705/2 |
| 2015/0248012 | A1* | 9/2015 | Schowengerdt | G06F 3/1423 359/627 |
| 2015/0372064 | A1* | 12/2015 | Kim | G02F 1/133504 349/33 |
| 2015/0378205 | A1* | 12/2015 | Kim | C09K 19/02 349/33 |
| 2016/0199012 | A1* | 7/2016 | Choi, II | A61B 6/14 378/40 |
| 2017/0061904 | A1* | 3/2017 | Lin | G09G 3/3426 |
| 2017/0090209 | A1* | 3/2017 | Brindisi | G02B 27/2271 |
| 2017/0214909 | A1* | 7/2017 | Subrahmanyam | G02B 27/2271 |
| 2018/0190217 | A1* | 7/2018 | Jung | G02F 1/133514 |
| 2019/0004319 | A1* | 1/2019 | Karafin | G02B 3/08 |
| 2019/0074444 | A1* | 3/2019 | Son | B32B 37/12 |
| 2019/0130801 | A1* | 5/2019 | Kim | H01L 27/3267 |
| 2020/0038549 | A1* | 2/2020 | Stoy | A61L 27/50 |

FOREIGN PATENT DOCUMENTS

| | | |
|---|---|---|
| CN | 105828719 A | 8/2016 |
| KR | 10-2008-0114173 A | 12/2008 |

* cited by examiner

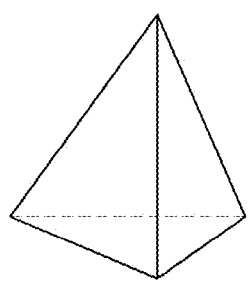
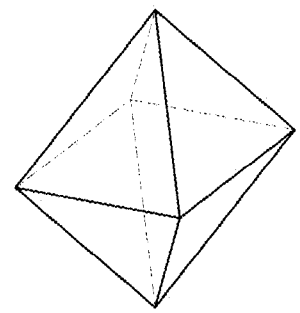
FIG. 14A  FIG. 14B
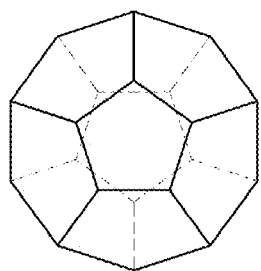
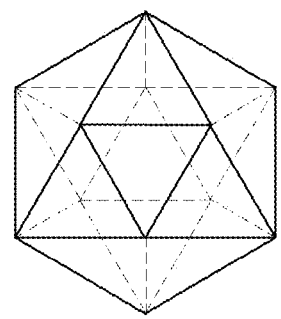
FIG. 14C  FIG. 14D

VOLUMETRIC TYPE THREE-DIMENSIONAL DISPLAY DEVICE

CROSS-REFERENCE TO RELATED APPLICATION

This application claims the priority of Korean Patent Application No. 10-2017-0144274 filed on Oct. 31, 2017, in the Korean Intellectual Property Office, the disclosure of which is incorporated herein by reference in its entirety.

BACKGROUND

Field of the Disclosure

The present disclosure relates to a three-dimensional display device, and more particularly, to a volumetric type three-dimensional display device in which a plurality of voxels is three-dimensionally laminated.

Description of the Background

A three-dimensional imaging technology which enables three-dimensional depth and stereoscopic feeling from planar images has a wide impact on home appliances, communication industries, aerospace, arts industries, and automobile business as well as directly related fields such as a display.

One of the most important factors which allow a human to feel depth and stereoscopic feelings is binocular parallax due to a distance between both eyes. The three-dimensional images are formed by the principle of stereoscopic vision through two eyes of a human so that the binocular parallax caused by the distance between two eyes which is approximately 65 mm may be the most important factor of the stereoscopic effect. In addition to this, the three-dimensional images are also deeply related to psychological and memory factors. Therefore, the three-dimensional imaging technique is also divided into a volumetric type, a holographic type, and a stereoscopic type based on how much three-dimensional image information is supplied to an observer.

The volumetric type is a method which makes perception of a depth direction to be felt by the psychological factor and a suction effect. The volumetric type is being applied to a three-dimensional computer graphic which displays a perspective view, superposition, shade, and contrast, and motion by calculation or so-called IMAX films which provide a large screen having a wide viewing angle to an observer to cause optical illusion to be sucked into the space.

The holographic type which is known as the most complete stereoscopic imaging technology is represented by laser light reproduction holography or white light reproduction holography.

The stereoscopic type is a method of feeling a stereoscopic effect using the physiological factors of both eyes. Such a stereoscopic type may be classified into a glasses type using special glasses on an observer side depending on a location where an actual stereoscopic effect is generated or a glasses-free type using a lens array such as a parallax barrier and a lenticular, or integral on a display surface side.

Among them, the volumetric type is widely studied because it can provide a large screen.

The volumetric type three-dimensional display device physically forms an actual shape in a space to represent a three-dimensional image. A physical voxel is formed to provide all psychological depth cognitive factors to represent a very natural three-dimensional image.

The volumetric type three-dimensional display device may be classified into a rotary screen, a multi-depth flat screen, a variable-focus lens, or a cross-beam type depending on a method of forming the voxel in the space.

However, it is difficult for the volumetric type three-dimensional display device of the conventional art to properly represent an outline of an object due to interference of light from surrounding pixels. Further, when a laser plasma or a light emitting diode (LED) is used, it is difficult to represent gray scales and colors and some technologies have a difficulty in implementation of a real volumetric type three-dimension which can be simultaneously watched at all directions of 360 degrees.

SUMMARY

Therefore, inventors of the present disclosure invented a volumetric type three-dimensional display device in which voxels having a polyhedron shape are three-dimensionally laminated. That is, the inventors of the present disclosure three-dimensionally laminate voxels having a polyhedron shape and configure a unit display panel by providing a polymer dispersed liquid crystal display device, on each surface of a polyhedron and providing an organic electroluminescent device on each corner of the polyhedron shape. Therefore, colors and gray scales are represented using an organic electroluminescent device and light from the voxel which is not selected is blocked using the polymer dispersed liquid crystal display device, thereby removing a difficulty in representation of an outline of an object due to the interference of light.

Accordingly, the present disclosure is to provide a volumetric type three-dimensional display device which installs a polymer dispersed liquid crystal display on each surface of a polyhedron on which images are displayed by the organic electroluminescent device to block light from the voxel which is not selected, thereby minimizing interference of light emitted from surrounding pixels.

In addition, the present disclosure is to provide a volumetric type three-dimensional display device which represents colors and gray scales using an organic electroluminescent device of a voxel selected from voxels which are three-dimensionally laminated to implement a real volumetric type three-dimension which can be simultaneously watched at all directions of 360 degrees.

The present disclosure is not limited to the above-mentioned objects, and other objects, which are not mentioned above, can be clearly understood by those skilled in the art from the following descriptions.

According to an aspect of the present disclosure, provided is a volumetric type three-dimensional display device comprising a plurality of voxels having a polyhedron shape laminated three-dimensionally and a unit display panel is configured by providing a polymer dispersed liquid crystal display device on at least one surface of the polyhedron and providing an organic electroluminescent device on at least one corner of the polyhedron.

Other detailed matters of the exemplary aspects are included in the detailed description and the drawings.

According to the present disclosure, colors and gray scales are represented using an organic electroluminescent device and light from a voxel which is not selected is blocked using the polymer dispersed liquid crystal display device, thereby removing a difficulty in representation of an outline of the object due to the interference of light. Therefore, very natural three-dimensional images having clear color and gray scale may be implemented.

Further, according to the present disclosure, it is possible to implement a real volumetric type three-dimension which may be simultaneously watched at all directions of 360 degrees by representing the colors and gray scales using the organic electroluminescent device in a voxel selected from voxels which are three-dimensionally laminated.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 14A to 14D are views illustrating a volumetric type three-dimensional display device according to another exemplary aspect of the present disclosure as an example.

DETAILED DESCRIPTION

Figure 1:
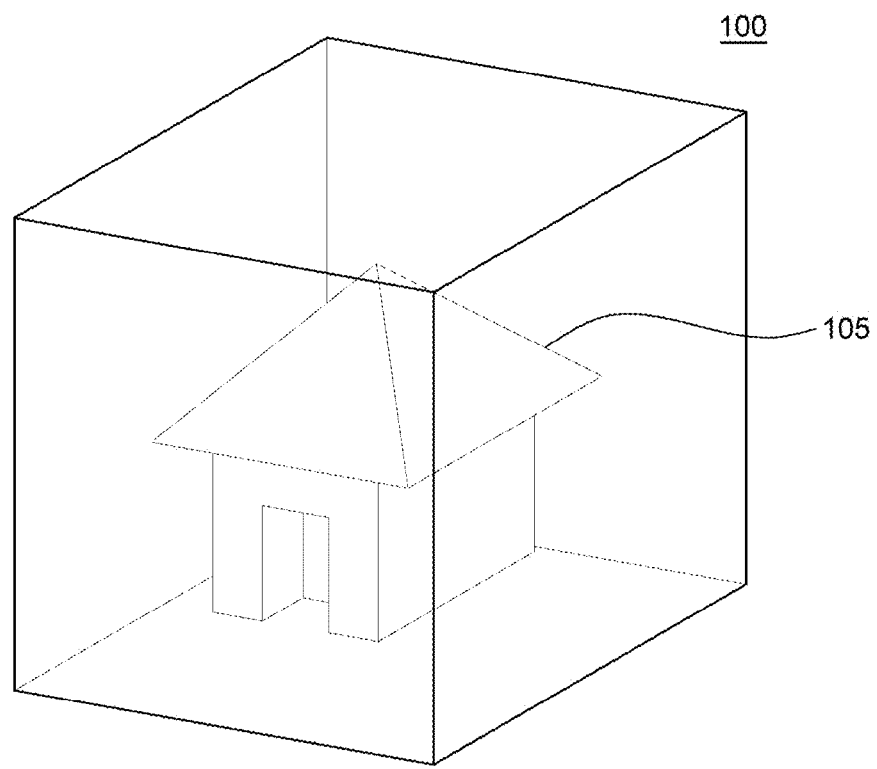
FIG. 1 is a perspective view illustrating a volumetric type three-dimensional display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a perspective view illustrating a volumetric type three-dimensional display device according to an exemplary aspect of the present disclosure.

Figure 2:
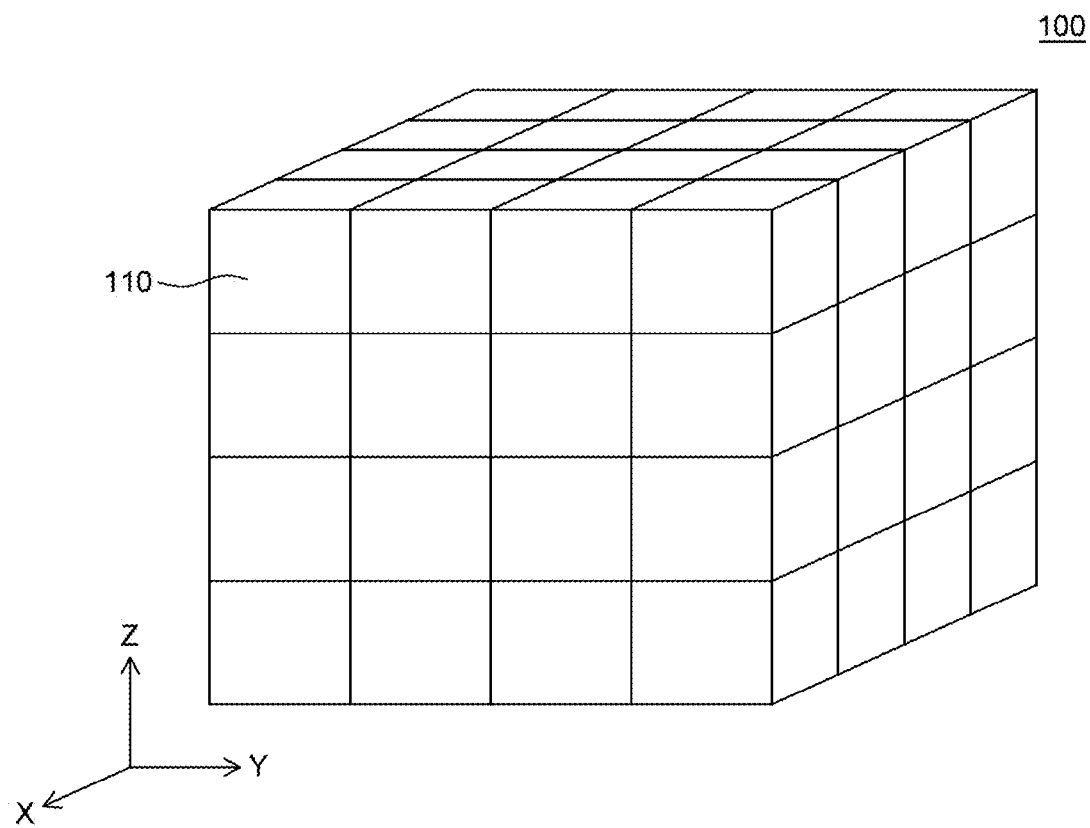
FIG. 2 is a perspective view for explaining a volumetric type three-dimensional display device according to an exemplary aspect of the present disclosure.

FIG. 2 is a perspective view for explaining a volumetric type three-dimensional display device according to an exemplary aspect of the present disclosure.

Figure 3:
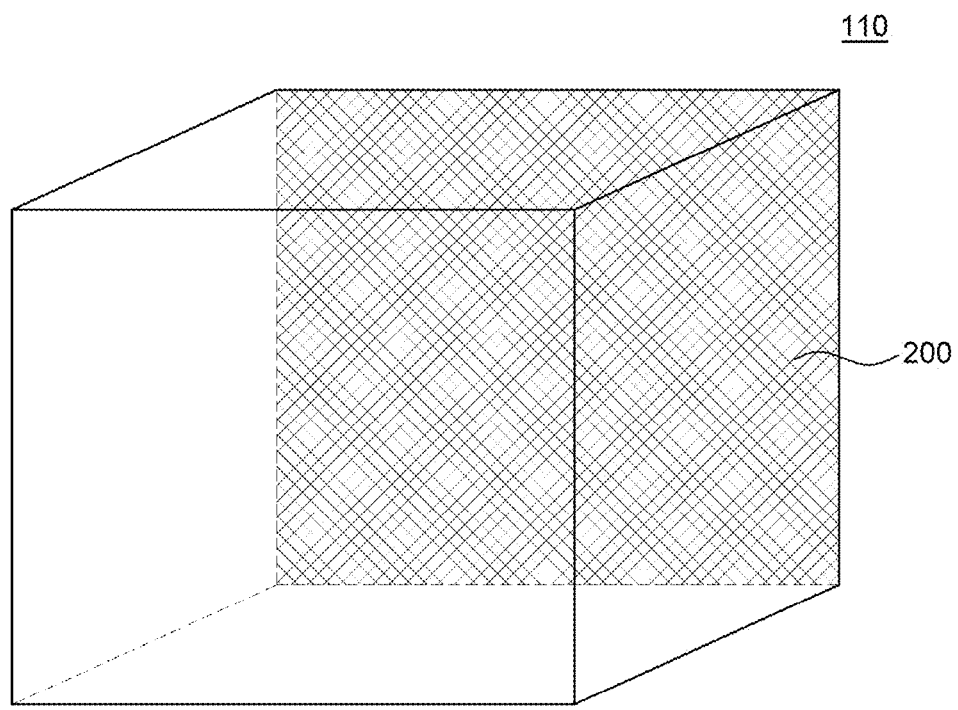
FIG. 3 is a view illustrating one voxel as an example, in a volumetric type three-dimensional display device according to an exemplary aspect of the present disclosure which is illustrated in FIG. 2.

FIG. 3 is a view illustrating one voxel as an example, in a volumetric type three-dimensional display device according to an exemplary aspect of the present disclosure which is illustrated in FIG. 2.

Referring to FIGS. 1 to 3, a volumetric type three-dimensional display device 100 according to an exemplary aspect of the present disclosure may be formed by three-dimensionally laminating at least one voxel 110.

For example, the volumetric type three-dimensional display device 100 may have a hexahedron shape. Hereinafter, even though it will be described that the volumetric type three-dimensional display device 100 has a hexahedron shape, a shape of the volumetric type three-dimensional display device 100 according to the present disclosure is not limited thereto. The voxel 110 may also have a hexahedron shape, but the present disclosure is not limited thereto.

For example, referring to FIG. 2, the volumetric type three-dimensional display device 100 according to the exemplary aspect of the present disclosure may have a (regular) hexahedron shape formed by laminating 64 (regular) hexahedral voxels 110. However, the present disclosure is not limited thereto and the volumetric type three-dimensional display device 100 may have various (regular) polyhedron shape such as a (regular) tetrahedron shape, a (regular) octahedron shape, a (regular) dodecahedron shape, and a (regular) icosahedron shape, in addition to a (regular) hexahedron shape.

As the number of voxels 110 included in the volumetric type three-dimensional display device 100 is increased, the three-dimensional image may be more finely represented. Therefore, in FIG. 2, an example having 64 voxels 110 is illustrated, but the number of voxels 110 is not limited thereto.

Further, the volumetric type three-dimensional display device 100 according to the exemplary aspect of the present disclosure and the voxels 110 may have an irregular shape in addition to the above-described (regular) polyhedron.

As described above, the volumetric type is a method which makes perception of a depth direction to be felt by the psychological factor and a suction effect.

To this end, the volumetric type three-dimensional display device 100 represents a three-dimensional image 105 by physically forming a real shape in a space. That is, a physical voxel 110 is formed in a three-dimensional space to provide all psychological depth cognitive factors to represent a very natural three-dimensional image.

However, the volumetric type three-dimensional display device of the related art has a difficulty not only in proper representation of an outline of an object due to interference of light from surrounding pixels, but also in some gray scale and color representation. Further, some technologies have a difficulty in implementation of a real volumetric type three-dimension which is simultaneously watched from all directions of 360 degrees.

Therefore, the present disclosure provides a volumetric type three-dimensional display device 100 in which voxels 110 having a polyhedron shape are three-dimensionally laminated.

That is, in the volumetric type three-dimensional display device 100 according to the exemplary aspect of the present disclosure, voxels 110 having a polyhedron shape are three-dimensionally laminated. Further, a unit display panel 200 may be configured by providing a polymer dispersed liquid crystal display device (PDLC) on at least one surface of the polyhedron 110 and an organic electroluminescent device (OLED) on at least one corner of the polyhedron 110.

In this case, the one corner on which the organic electroluminescent device of the corresponding voxel 110 is provided may be one of four corners abutting on one surface of the polyhedron 110 where the polymer dispersed liquid crystal display device is provided.

In addition, a cover (not illustrated) may wrap an outer side of the three-dimensional shape formed by laminating the voxels 110 having a polyhedron shape. The cover may be a transparent material.

As described above, the organic electroluminescent device is configured on one corner of the corresponding voxel 110 and the polymer dispersed liquid crystal display is configured on one surface of the voxel 110 which abuts the corner.

The unit display panel 200 is formed of a transparent material to be also used as a transparent display. That is, the unit display panel may be used as various types of transparent displays by selectively driving the organic electroluminescent device and the polymer dispersed liquid crystal display device.

The unit display panel 200 may be configured on at least one surface of the voxel 110. However, the unit display panel 200 may be configured in only one voxel 110 so as not to overlap each other on a surface on which the adjacent voxels 110 abut.

Hereinafter, a structure of the unit display panel will be described in detail with reference to the drawings.

Figure 4:
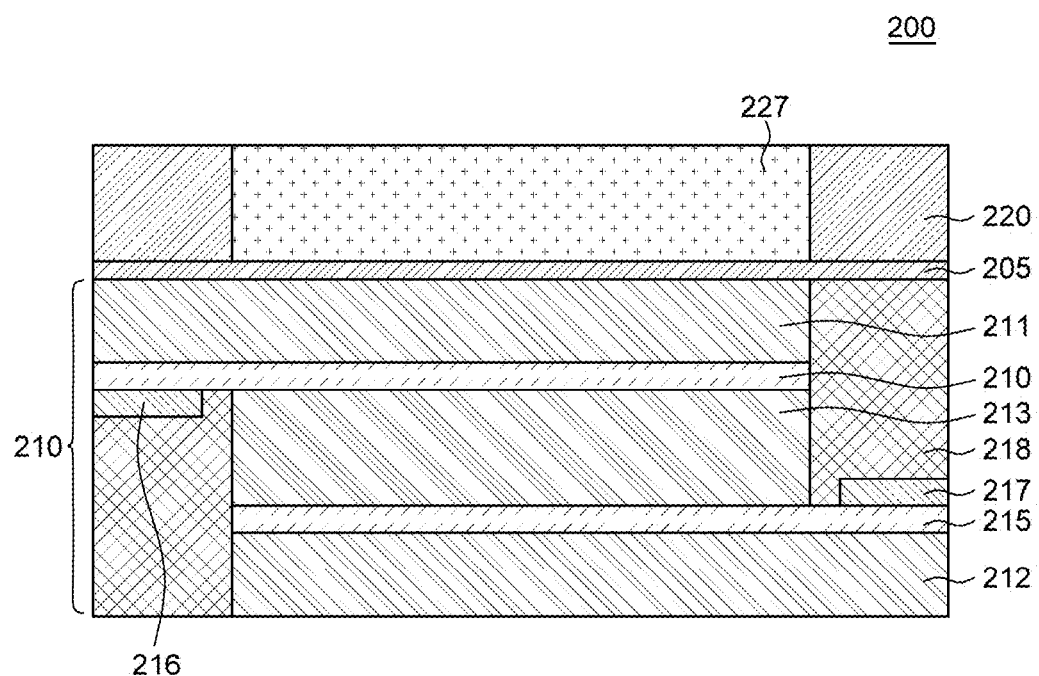
FIG. 4 is a cross-sectional view illustrating one unit display panel as an example in a voxel according to an exemplary aspect of the present disclosure illustrated in FIG. 3.
Figure 5:
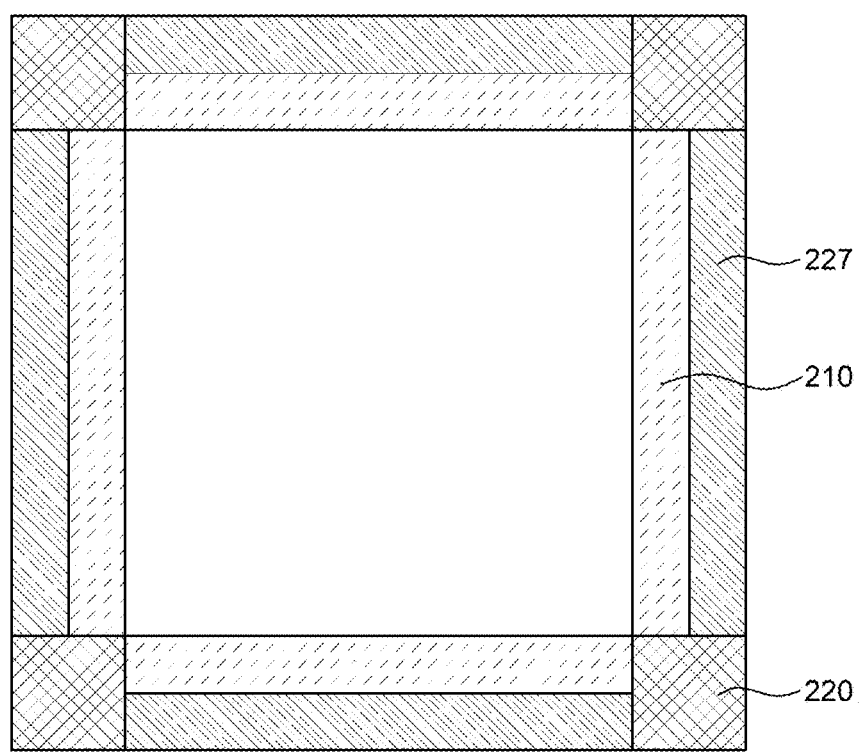
FIG. 5 is a cross-sectional view illustrating a voxel according to the exemplary aspect of the present disclosure illustrated in FIG. 3.

FIG. 4 is a cross-sectional view illustrating one unit display panel as an example in a voxel according to an exemplary aspect of the present disclosure illustrated in FIG. 3. FIG. 5 is a cross-sectional view illustrating a voxel according to the exemplary aspect of the present disclosure illustrated in FIG. 3.

In this case, FIG. 5 specifically illustrates a part of the voxel illustrated in FIG. 4, for example, an upper portion of the voxel.

Referring to FIGS. 4 and 5, the unit display panel 200 according to the exemplary aspect of the present disclosure is formed of an organic electroluminescent device 220 and a polymer dispersed liquid crystal display device 210.

In this case, the organic electroluminescent device 220 may be provided at least one side of the polymer dispersed liquid crystal display device 210 and a transparent light guide panel 227 may be disposed between the organic electroluminescent devices 220. However, the present disclosure is not limited thereto and an empty space may be formed between the organic electroluminescent devices 220 instead of the light guide plate 227.

The light guide plate 227 may function to guide light emitted from the organic electroluminescent device 220 to uniformly transmit the light to one surface of the voxel 110 including the polymer dispersed liquid crystal display device 210. The light which is projected onto one surface of the voxel 110 to be displayed may configure a part of a three-dimensional image.

An adhesive agent 205 may be interposed between the organic electroluminescent device 220, the light guide plate 227, and the polymer dispersed liquid crystal display device 210. Further, a cover (not illustrated) which covers a side surface of the organic electroluminescent device may be provided at an outside of at least one corner of the polyhedron.

As described above, the organic electroluminescent device 220 is configured on one corner of the corresponding voxel 110 and the polymer dispersed liquid crystal display device 210 is configured on one surface of the voxel 110 which abuts the corresponding corner. Therefore, light emitted from the organic electroluminescent device 220 may be projected onto the polyhedron surface of each voxel 110 to be outwardly radiated.

Figure 6:
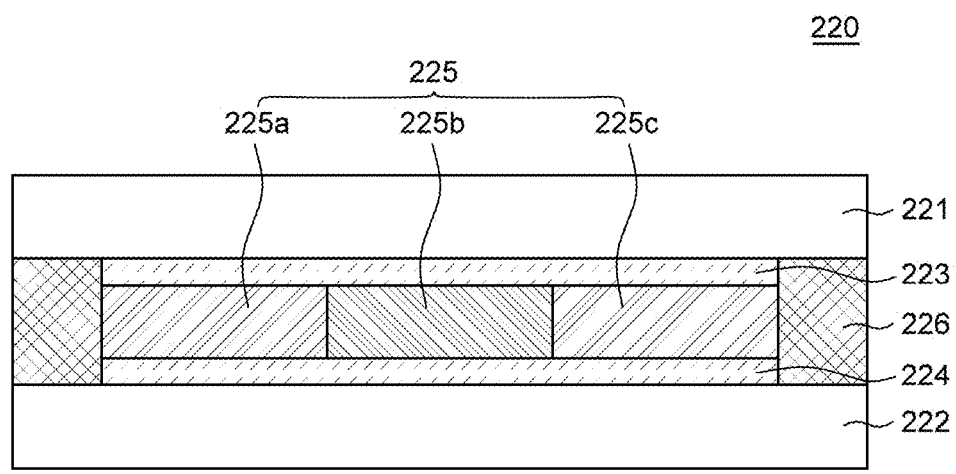
FIG. 6 is a view illustrating a cross-section of an organic electroluminescent device in a unit display panel according to an exemplary aspect of the present disclosure illustrated in FIG. 4.

FIG. 6 is a view illustrating a cross-section of an organic electroluminescent device in a unit display panel according to an exemplary aspect of the present disclosure illustrated in FIG. 4.

Figure 7A:
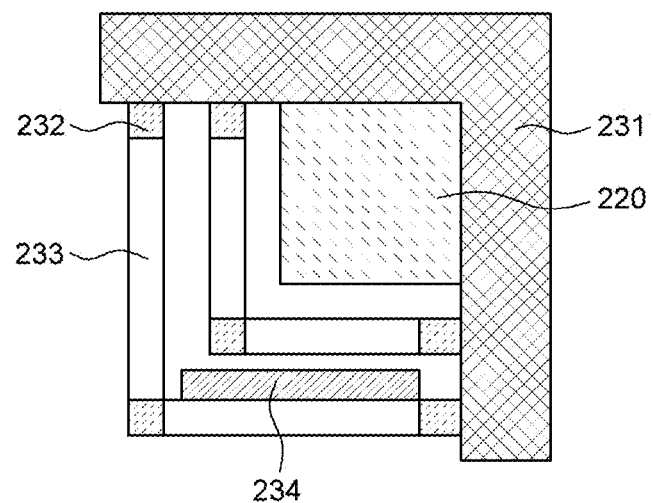
FIG. 7A is a view illustrating a cross-sectional structure of an organic light emitting display diode provided at one corner, as an example, in a voxel according to an exemplary aspect of the present disclosure illustrated in FIG. 5.
Figure 7B:
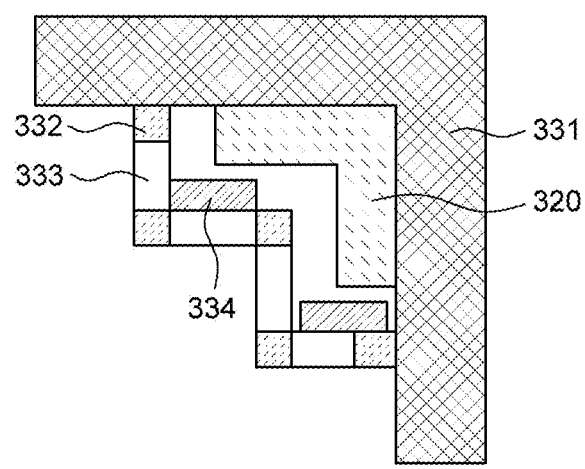
FIG. 7B is a view illustrating a cross-sectional structure of an organic light emitting display diode provided at one corner, as an example, in a voxel according to another exemplary aspect of the present disclosure illustrated in FIG. 5.

FIG. 7A is a view illustrating a cross-sectional structure of an organic light emitting display diode provided on one corner, as an example, in a voxel according to an exemplary aspect of the present disclosure illustrated in FIG. 5. FIG. 7B is a view illustrating a cross-sectional structure of an organic light emitting display diode provided on one corner, as an example, in a voxel according to another exemplary aspect of the present disclosure illustrated in FIG. 5.

In this case, FIGS. 7A and 7B illustrate a cross-sectional structure of an organic light emitting display located at right upper side, as an example, in the voxel illustrated in FIG. 5.

Referring to FIG. 6, the organic electroluminescent device 220 according to the exemplary aspect of the present disclosure is located on a corner of the voxel 110 and may include a substrate 222 partitioned into a plurality of sub pixels, a first electrode 224 on the substrate 222, an organic layer 225 on the first electrode 224, a second electrode 223 on the organic layer 225, and a protective film 221 on the second electrode 223.

The organic electroluminescent device 220 is a device in which holes and electrons are injected from the first electrode 224 and the second electrode 223 into an organic light emitting layer and excitons formed by coupling the injected holes and electrons fall from an excited state to a ground state to emit light having a predetermined wavelength.

By this principle, differently from the liquid crystal display device of the related art, the organic electroluminescent device 220 does not require a separate light source so that a volume and a weight of the device may be reduced.

In this case, even though FIG. 6 illustrates a top emission type organic electroluminescent device 220 as an example, the present disclosure is not limited thereto. In the top emission type organic electroluminescent device 220, the substrate 222 may be located at an outer side of the corner of the voxel 110.

The present disclosure may also be applied to a bottom emission type organic electroluminescent device 220 and in this case, the substrate 222 of the organic electroluminescent device 220 is located inside the corner of the voxel 110.

As the substrate 222, a transparent insulating substrate may be used and an example of a material thereof may include glass or plastic.

Specifically, as the transparent substrate 222, a polymer material such as plastic may be used. The polymer material has an advantage of being light and flexible. Recently, a transparent nanofiber having a diameter of 100 nm or smaller is used as a reinforcing material so that a polymer substrate having flexibility, transparency having 85% or higher transmittance, and low thermal expansion coefficient can be manufactured.

The protective film 221 may also be formed of a transparent material.

The first electrode 224 may be electrically connected to a drain electrode (not illustrated) of a thin film transistor. The first electrode 224 serving as an anode may be formed of a conductive material having a high work function to supply holes to the organic layer 225. For example, the first electrode 224 may be formed of a transparent conductive material such as indium tin oxide (ITO), indium zinc oxide (IZO), and indium tin zinc oxide (ITZO).

The organic layer 225 includes an organic light emitting layer for emitting specific color light and includes one of a red organic light emitting layer 225a, a green organic light emitting layer 225b, and a blue organic light emitting layer 225c. The organic light emitting layer 225 may further include various sub layers such as a hole transport layer, a hole injecting layer, an electron injecting layer, or an electron transport layer. That is, in order to further increase a luminous efficiency, an electron transport layer may be added between the second electrode 223 and the organic light emitting layer 225 and a hole transport layer may be added between the first electrode 224 and the organic light emitting layer 225.

The organic layer 225 may emit light toward the polyhedron surface of voxel 110.

In FIG. 6, it is illustrated that the substrate 222 is partitioned into a plurality of sub pixels and each sub pixel include a red sub pixel which emits red light, a green sub pixel which emits green light, and a blue sub pixel which emits blue light. Further, in FIG. 6, it is illustrated that each sub pixel includes a red organic light emitting layer 225a, a green organic light emitting layer 225b, and a blue organic light emitting layer 225c, as an example, but the present disclosure is not limited thereto. Each sub pixel may further include a transmissive unit disposed in the red, green, and blue sub pixels. Alternatively, each sub pixel may further include a transmissive unit in addition to the red, green, and blue sub pixels.

The second electrode 223 may be disposed on the organic layer 225. The second electrode 223 serving as a cathode supplies electrons to the organic layer 225. The second electrode 223 may be formed of transparent conductive oxide such as indium tin oxide (ITO), indium zinc oxide (IZO), indium tin zinc oxide (ITZO), zinc oxide (ZnO), and tin oxide (TO) and an ytterbium (Yb) alloy.

In a non-display area, a predetermined wiring line (not illustrated) may be disposed and the wiring line may be formed of the same material as a conductive component disposed in the display area. For example, the wiring line may be formed of the same material as the first electrode 224, but the present disclosure is not limited thereto.

A part of the wiring line is electrically connected to the second electrode 223 and a power supply line (not illustrated) to supply the power from the power supply line to the second electrode 223. That is, a low potential voltage transmitted from the chip on film (COF) sequentially passes through the power supply line and the wiring line to be transmitted to the second electrode 223.

Even though not illustrated, an encapsulating unit which protects the organic layer 225 which is vulnerable to moisture may be formed above the organic layer 225 to suppress from being exposed to the moisture. For example, the encapsulating layer may have a structure in which an inorganic layer and an organic layer are alternately laminated.

Even though a first sealing unit 226 may be provided on a side of the organic electroluminescent device 220 configured as described above, the present disclosure is not limited thereto.

Further, referring to FIGS. 7A and 7B, covers 231 and 331 which cover both sides of the organic electroluminescent devices 220 and 320 are provided at the outside of at least one corner of the polyhedron. For example, the covers 231 and 331 may be provided to cover both sides which are located at the outside of the voxel 110 among sides of the organic electroluminescent devices 220 and 320.

In this case, at least one window 233 and 333 which covers other sides of the organic electroluminescent devices 220 and 320 which are not covered by the covers 231 and 331 may be located inside the voxel 110.

The windows 233 and 333 may be composed of a transparent material such as glass and may be divided into a plurality of windows. In this case, the plurality of divided windows 233 and 333 may be coupled to each other or bonded to the covers 231 and 331 by predetermined adhesive agents 232 and 332.

The windows 233 and 333 may be configured to be divided according to an outer appearance of the organic electroluminescent devices 220 and 320 located inside the voxel 110.

The plurality of windows 233 and 333 may be arranged in a plurality of rows or columns.

Further, moisture absorbents 234 and 334 may be disposed between the windows 233 and 333 and the organic electroluminescent devices 220 and 320 or between windows 233 and 333 which are arranged in a plurality of rows or columns to absorb moisture.

Next, the polymer dispersed liquid crystal display device 210 is a display device which displays images by changing an amount of transmitted light of liquid crystals dispersed in a polymer. However, in the present disclosure, the polymer dispersed liquid crystal display device may be provided on a polyhedron surface on which light emitted from the organic electroluminescent device 220 is projected to block light of the voxel 110 which is not selected.

That is, the polymer dispersed liquid crystal display device 210 according to the exemplary aspect of the present disclosure blocks light emitted from pixels distributed around the voxel 110 which is selected to implement an outline of a three-dimensional image, that is, voxels 110 which are not selected, to minimize the interference of light.

Figure 8A:
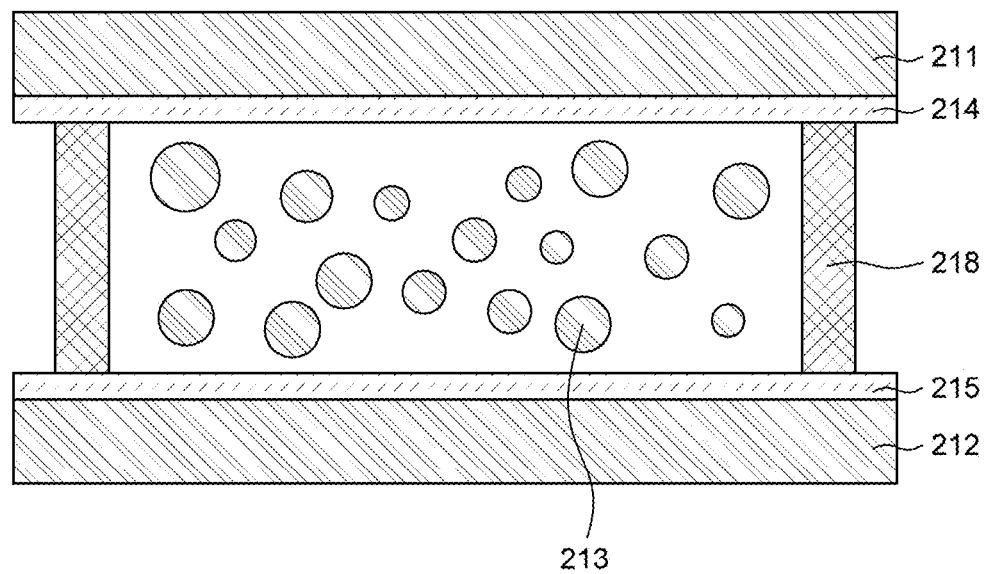
FIGS. 8A and 8B are views illustrating cross-sections of a polymer dispersed liquid crystal display device and a polymer dispersed liquid crystal display device cell, as an example, in a unit display panel according to an exemplary aspect of the present disclosure illustrated in FIG. 4.
Figure 8B:
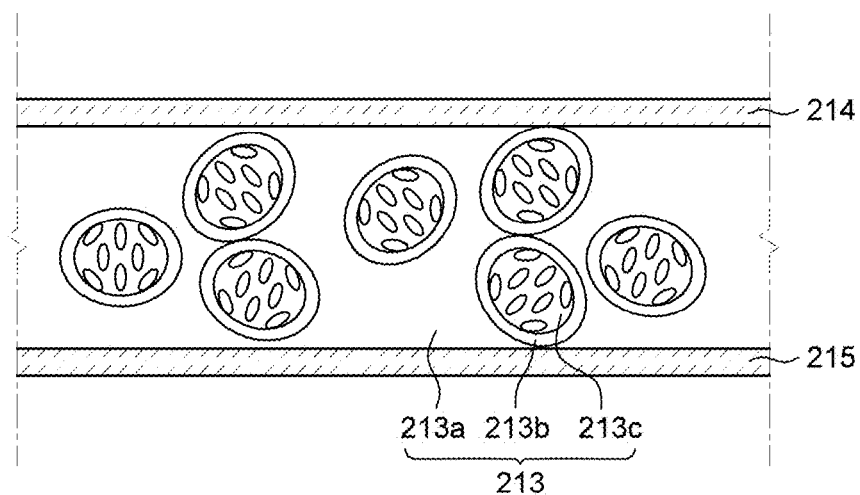

FIGS. 8A and 8B are views illustrating cross-sections of a polymer dispersed liquid crystal display device and a polymer dispersed liquid crystal display device cell, as an example, in a unit display panel according to an exemplary aspect of the present disclosure illustrated in FIG. 4.

Figure 9A:
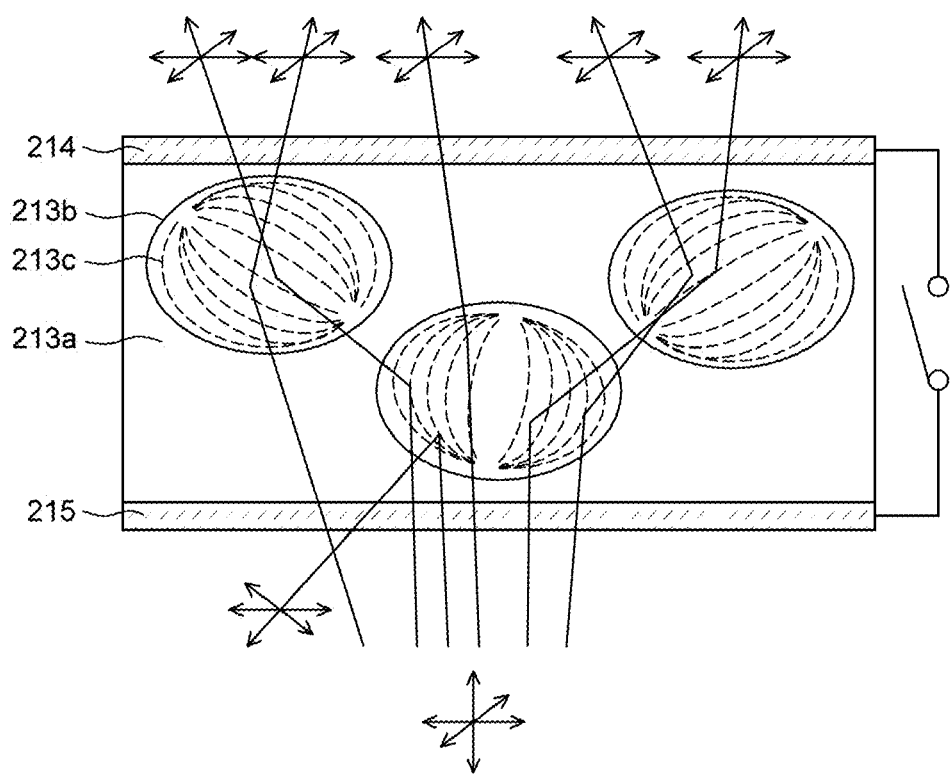
FIGS. 9A and 9B are cross-sectional views illustrating a driving principle of a polymer dispersed liquid crystal display device according to an exemplary aspect of the present disclosure.
Figure 9B:
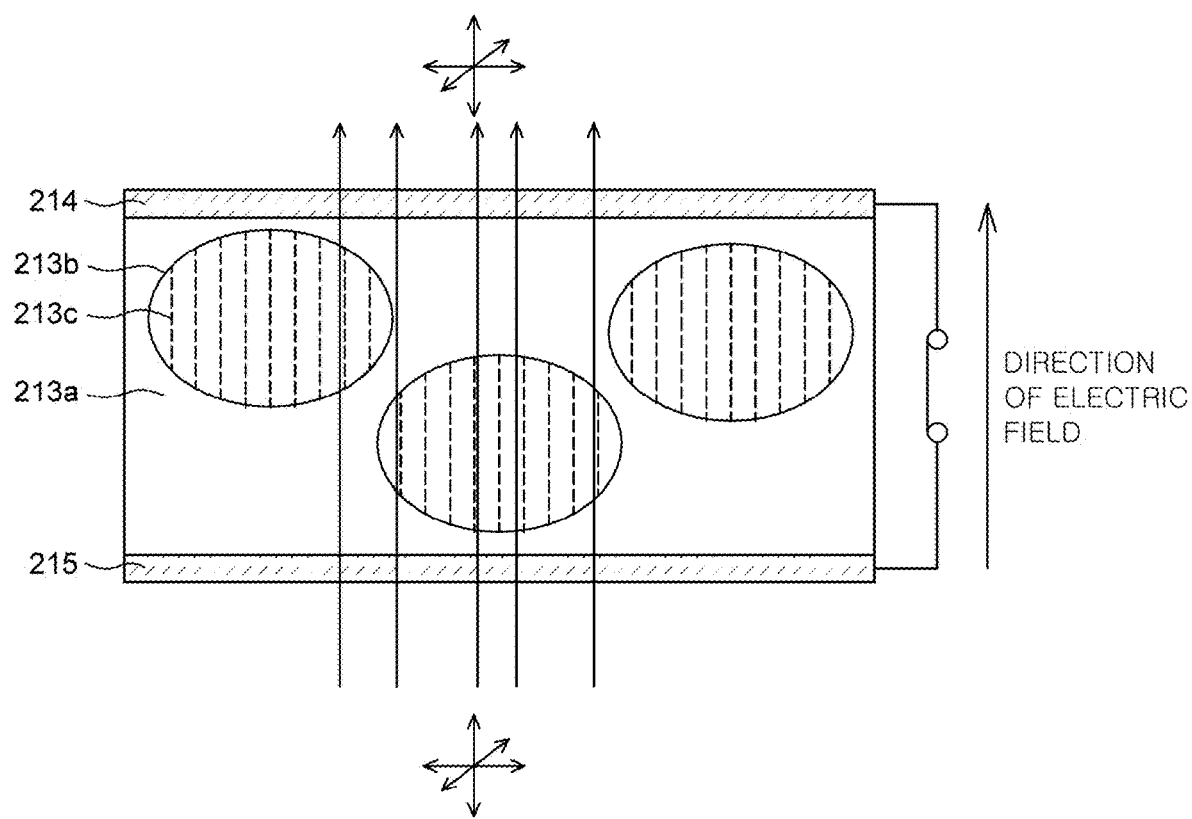

FIGS. 9A and 9B are cross-sectional views illustrating a driving principle of a polymer dispersed liquid crystal display device according to an exemplary aspect of the present disclosure.

Referring to FIG. 8A (and FIG. 4), the polymer dispersed liquid crystal display device 210 according to the exemplary aspect of the present disclosure includes a first substrate 211 and a second substrate 212 which are bonded to be opposite to each other, first and second electrodes 214 and 215 disposed in the first and second substrates 211 and 212, respectively, and a polymer dispersed liquid crystal layer 213 disposed between the first and second electrodes 214 and 215.

A second sealing unit 218 may be provided at the side of the first and second substrates 211 and 212 so as to suppress the liquid crystal from flowing between the first and second substrates 211 and 212.

The second sealing unit 218 may be configured by a conductive adhesive agent and may be located on one corner of the polyhedron together with the first sealing unit 226. For example, referring to FIG. 8B, the polymer dispersed liquid crystal layer 213 is configured by a polymer dispersed liquid crystal display device cell which is configured by liquid crystals 213c filled in a capsule-shaped polymer ball 213b so that an alignment of the liquid crystals 213c is changed in accordance with the applied voltage of the first and second electrodes 214 and 215. In this case, the polymer balls 213b may be irregularly dispersed on a polymer layer 213a of the polymer dispersed liquid crystal display device cell.

The first and second substrates 211 and 212 may be composed of a transparent film.

The first and second electrodes 214 and 215 may be formed of transparent conductive oxide such as indium tin oxide (ITO), indium zinc oxide (IZO), indium tin zinc oxide (ITZO), zinc oxide (ZnO), and tin oxide (TO). The first and second electrodes 214 and 215 may be applied with voltages from the first and second transparent wiring lines 216 and 217 (shown in FIG. 4).

Such a structure of the polymer dispersed liquid crystal display device uses a phenomenon that when two types of liquids which are transparent but are not dissolved with each other and have different refractive indices are forcibly mixed, the whole liquids become a milky white state. This phenomenon is caused because the mixed liquids become opaque and light is scattered from the interface due to the difference in refractive indices of two liquids when the light passes through the interface.

When the voltage is not applied to the polymer dispersed liquid crystal display device 210 configured as described above, referring to FIG. 9A, all the incident light is scattered due to the different refractive indices between the liquid crystal 213c and the polymer ball 213b so that the polymer dispersed liquid crystal display device becomes a milky white opaque state.

However, when the voltage is applied to the first and second electrodes 214 and 215 of the polymer dispersed liquid crystal display device 210, referring to FIG. 9B, the liquid crystals 213c are aligned to an electric field direction so that all particles have the constant refractive index. In this case, when the refractive indices of the polymer ball 213b and the liquid crystal 213c are equal to each other, scattering is not caused at the interface therebetween and it looks transparent.

Therefore, the transmittance of the polymer dispersed liquid crystal display device 210 varies depending on whether the voltage is on or off and functions to block the light from the voxel 110 which is not selected using this property.

The volumetric type three-dimensional display device 100 according to the exemplary aspect of the present disclosure represents the colors and the gray scales using the organic electroluminescent device 220 and blocks light from the voxel which is not selected using the polymer dispersed liquid crystal display device 210 so that a difficulty in representation of an outline of an object due to the interference of light may be solved.

Further, it is possible to implement a real volumetric type three-dimension which may be simultaneously watched at all directions of 360 degrees by representing the colors and gray scales using the organic electroluminescent device 220 of a voxel selected from the voxels 110 which are three-dimensionally laminated.

The volumetric type three-dimensional display device 100 according to the exemplary aspect of the present disclosure configured as described above operates organic electroluminescent devices 220 of the voxel 110 corresponding to a three-dimensional coordinate value of a three-dimensional object to generate a three-dimensional image.

In this case, the organic luminescent device 220 may emit light with a color corresponding to a pixel value corresponding to the three-dimensional coordinate value. The pixel value may be a digital value which represents color, brightness, and saturation.

Figure 10:
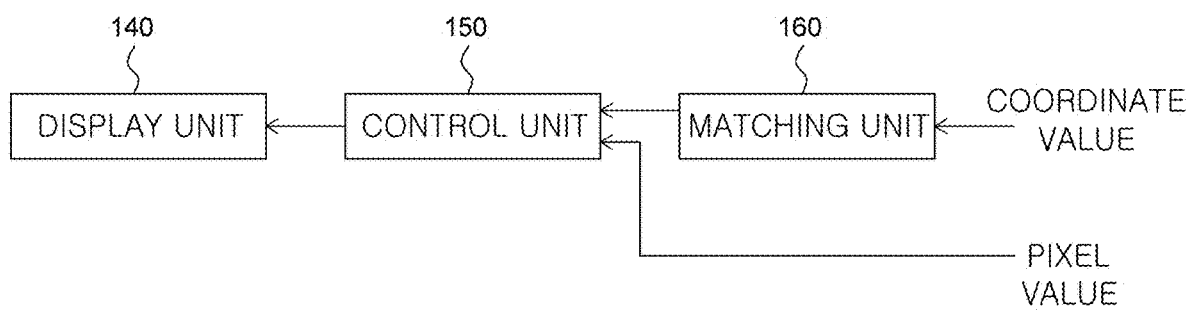
FIG. 10 is a view for explaining the driving of a volumetric type three-dimensional display device according to an exemplary aspect of the present disclosure.

FIG. 10 is a view for explaining the driving of a volumetric type three-dimensional display device according to an exemplary aspect of the present disclosure.

Figure 11A:
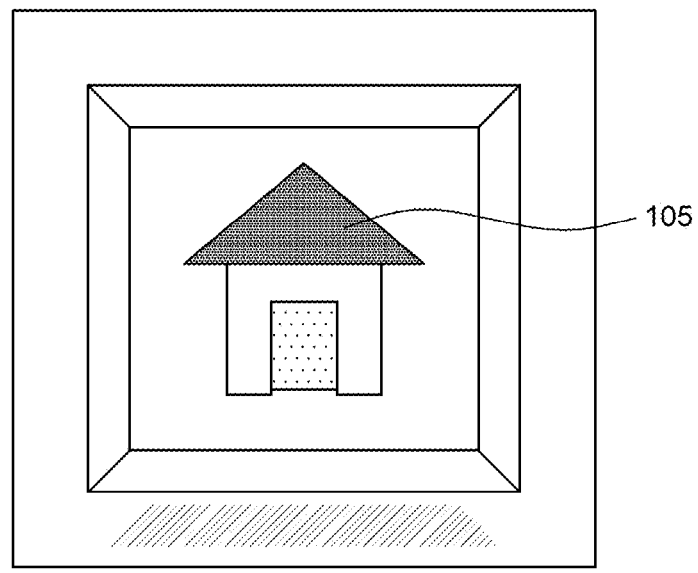
FIGS. 11A and 11B are front views of a volumetric type three-dimensional display device according to an exemplary aspect of the present disclosure.
Figure 11B:
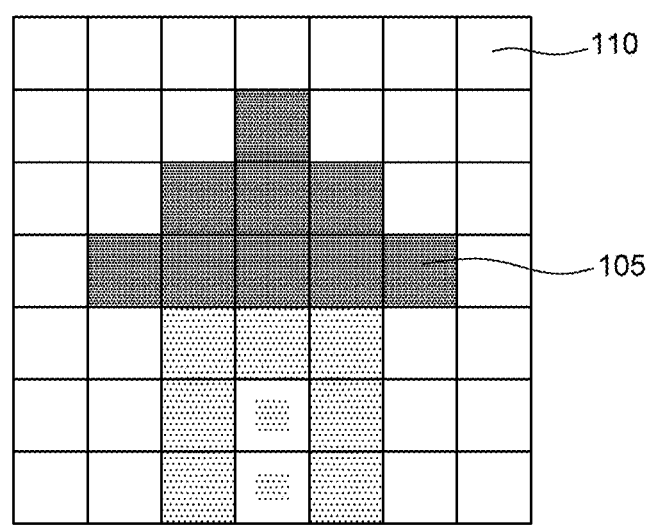

FIGS. 11A and 11B are front views of a volumetric type three-dimensional display device according to an exemplary aspect of the present disclosure.

Figure 12A:
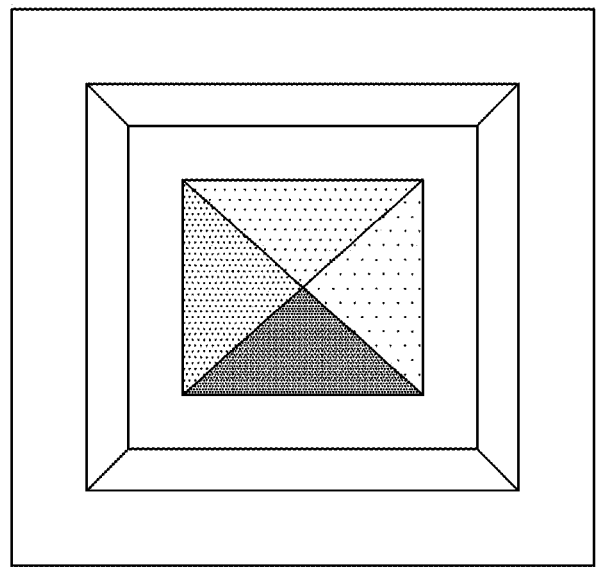
FIGS. 12A and 12B are top views of a volumetric type three-dimensional display device according to an exemplary aspect of the present disclosure.
Figure 12B:
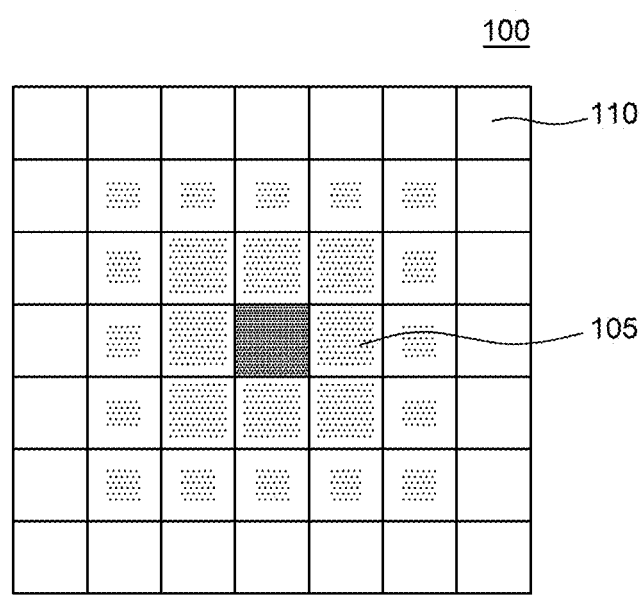

FIGS. 12A and 12B are top views of a volumetric type three-dimensional display device according to an exemplary aspect of the present disclosure.

Referring to FIG. 10, the volumetric type three-dimensional display device according to an exemplary aspect of the present disclosure may include a display unit 140, a control unit 150, and a matching unit 160.

The display unit 140 may be configured by the above-described voxels.

In this case, the matching unit 160 may match coordinate values of an object and voxels of the volumetric type three-dimensional display device. For example, the coordinate value of the object may be a three-dimensional coordinate value or a two-dimensional coordinate value. The matching unit 160 matches the coordinate value of the object with the voxel. For example, when the coordinate value of the object is (3, 1, 2), the matching unit 160 extracts a voxel corresponding to the coordinate value of the object and matches the coordinate value of the object with a pixel value of the extracted voxel. Further, when the coordinate value of the object is (3, 1, 3), the matching unit 160 extracts a voxel corresponding to the coordinate value of the object and matches the coordinate value of the object with a pixel value of the extracted voxel.

The control unit 150 may operate the organic electroluminescent device of the voxel based on the matching result and the pixel value which matches the coordinate value of the object. The control unit 150 may receive the pixel value which is matched to the coordinate value of the object from an internal or external storage device. For example, the control unit 150 may select a voxel corresponding to the coordinate value of the object. The control unit 150 may extract a pixel value of a voxel corresponding to the coordinate value of the object. The control unit 150 operates the organic electroluminescent device of the selected voxel so as to emit light having a color corresponding to the extracted pixel value. Therefore, the control unit 150 operates a voxel corresponding to the coordinate value of an outermost side of the object so that the image of the object may be displayed on the volumetric type three-dimensional display device. However, the present disclosure is not limited thereto and the control unit 150 operates voxels corresponding to all the coordinate values of the object to display the image of the object on the volumetric type three-dimensional display device.

The organic electroluminescent device and the polymer dispersed liquid crystal display device are controlled by one control unit 150. For example, a gate driver and a data driver are controlled by a timing controller to simultaneously drive the organic electroluminescent device and control the switching of the polymer dispersed liquid crystal display device.

Further, referring to FIGS. 11A, 11B, 12A and 12B, a volume of an object may be represented by converting outermost data of the three-dimensional object, that is, the outermost coordinate value as much as the maximum size of the volumetric type three-dimensional display device and displaying the outermost coordinate value in the corresponding voxel. That is, when coordinate values of the three-dimensional object are input, the coordinate values are normalized and rescaled to X, Y, and Z axes and then displayed in the corresponding voxel.

Further, time continuous row, column, and height three-dimensional matrix operations are periodically repeated to represent moving images.

FIGS. 13A to 13D are views illustrating a sub-pixel configuration of an organic electroluminescent device, as an example, in the unit display panel according to an exemplary aspect of the present disclosure illustrated in FIG. 4.

In this case, for example, the sub-pixel configuration of FIGS. 13A to 13D includes a predetermined transmitting unit to improve transmittance.

Referring to FIGS. 13A to 13D, as described above, the organic electroluminescent device 220, 320, 420, and 520 according to the exemplary aspect of the present disclosure may be partitioned into a plurality of sub pixels.

The sub pixels may be configured by a red sub pixel Pr which emit red light, a green sub pixel Pg which emit green light and a blue sub pixel Pb which emit blue light. However, the present disclosure is not limited thereto.

Figure 13A:
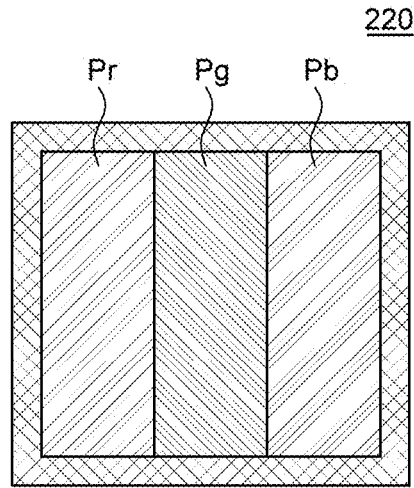
FIGS. 13A to 13D are views illustrating a sub-pixel configuration of an organic electroluminescent device, as an example, in the unit display panel according to an exemplary aspect of the present disclosure illustrated in FIG. 4.
Figure 13B:
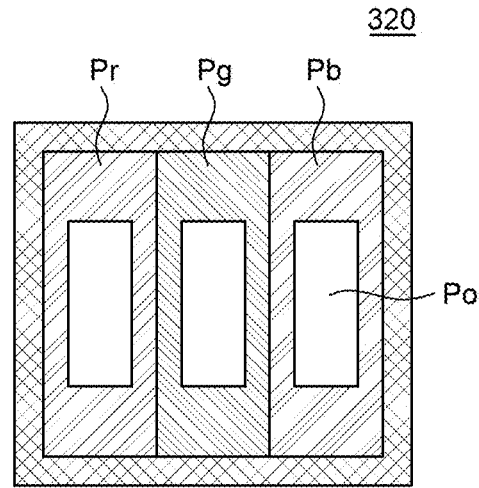
Figure 13C:
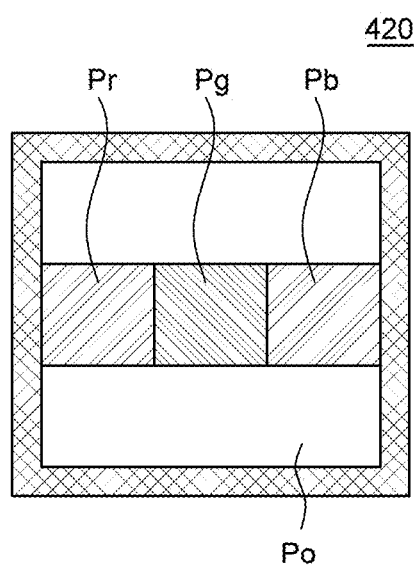
Figure 13D:
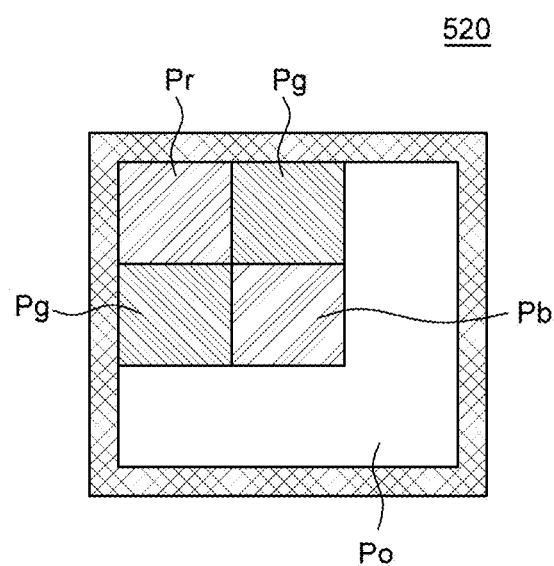

Further, in order to increase transmittance, the sub pixel may further include a transmitting unit Po disposed in the red sub pixel Pr, the green sub pixel Pg, and the blue sub pixel Pb (shown in FIG. 13B). In this case, the transmitting unit Po does not include any of light emitting layers and may be configured by a white sub pixel which emits white light.

Alternatively, the sub pixel may further include a transmitting unit Po in addition to the red sub pixel Pr, the green sub pixel Pg, and the blue sub pixel Pb. In this case, the transmitting unit Po may be located above and below the red sub pixel Pr, the green sub pixel Pg, and the blue sub pixel Pb (shown in FIG. 13C) or located at sides of at least two sub pixels Pg and Pb (shown in FIG. 13D). However, the present disclosure is not limited to the above-described sub-pixel structure, but may be applied to sub pixels having various structures.

FIGS. 14A to 14D are views illustrating a volumetric type three-dimensional display device according to another exemplary aspect of the present disclosure as an example.

Referring to FIGS. 14A to 14D, a volumetric type three-dimensional display device according to another exemplary aspect of the present disclosure may have various (regular) polyhedron shape such as a (regular) tetrahedron shape, a (regular) octahedron shape, a (regular) dodecahedron shape, and a (regular) icosahedron shape, in addition to a (regular) hexahedron shape.

The voxel also has various (regular) polyhedron shapes such as a (regular) tetrahedron shape, a (regular) octahedron shape, a (regular) dodecahedron shape, and a (regular) icosahedron shape, in addition to a (regular) hexahedron shape.

As the number of voxels included in the volumetric type three-dimensional display device is increased, the three-dimensional image may be more finely represented, but the present disclosure is not limited to the number of voxels.

Further, the volumetric type three-dimensional display device according to another exemplary aspect of the present disclosure and the voxels may have an irregular shape in addition to the above-described (regular) polyhedron.

The exemplary aspects of the present disclosure can also be described as follows:

According to an aspect of the present disclosure, provided is a volumetric type three-dimensional display device comprising a plurality of voxels having a polyhedron shape laminated three-dimensionally and a unit display panel is configured by providing a polymer dispersed liquid crystal display device on at least one surface of the polyhedron and providing an organic electroluminescent device on at least one corner of the polyhedron The organic electroluminescent device may include a substrate partitioned into a plurality of sub pixels, a first electrode on the substrate, an organic layer on the first electrode, a second electrode on the organic layer, and a protective film on the second electrode and the organic layer emits light toward one surface of the voxel.

The substrate and the protective film may be composed of a transparent material.

The sub pixel may include a red sub pixel which emits red light, a green sub pixel which emits green light, and a blue sub pixel which emits blue light.

The sub pixel may further include a transmitting unit disposed in the red, green, and blue sub pixels.

The sub pixel may further include a transmitting unit in addition to the red, green, and blue sub pixels.

The polymer dispersed liquid crystal display device may include a first substrate and a second substrate which are bonded to be opposite to each other; a first electrode and a second electrode disposed in the first substrate and the second substrate, respectively; and a polymer dispersed liquid crystal layer disposed between the first electrode and the second electrode.

The first and second substrates may be composed of a transparent film.

The first and second electrodes may be transparent and may be applied with a voltage from first and second transparent wiring lines.

The volumetric type three-dimensional display device may further comprise a cover which is formed of a transparent material to wrap an outer side of the three-dimensional shape.

The three-dimensional shape is one of a (regular) tetrahedron shape, a (regular) hexahedron shape, a (regular) octahedron shape, a (regular) dodecahedron shape, and a (regular) icosahedron shape.

The volumetric type three-dimensional display device may further comprise a cover which blocks a side located outside the voxel, among sides of the organic electroluminescent device.

The volumetric type three-dimensional display device may further comprise a window which is located in the voxel and covers another side of the organic electroluminescent device which is not blocked by the cover.

The volumetric type three-dimensional display device may further comprise a moisture absorbent which is disposed between the window and the organic electroluminescent device.

the matching unit extracts a voxel corresponding to a coordinate value of an object and matches the coordinate value of the object and a pixel value of the extracted voxel, the control unit selects a voxel corresponding to the coordinate value of the object, extracts the pixel value of the voxel corresponding to the coordinate value of the object, and drives the organic electroluminescent device of the selected voxel to represent colors and gray scales corresponding to the extracted pixel value and the control unit blocks light from a voxel which is not selected using the polymer dispersed liquid crystal display device of the selected voxel.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A volumetric type three-dimensional display device comprising:
    a plurality of voxels having a polyhedron shape and laminated three-dimensionally to form a three-dimensional shape, wherein each of the plurality of voxels represents a full spectrum of colors and gray scales and surfaces of adjacent voxels are directly in contact with one another;
    a polymer dispersed liquid crystal display device disposed on at least one surface of the polyhedron shape except for the surfaces of the adjacent voxels;
    an organic electroluminescent device disposed on at least one corner of the polyhedron shape constituting a unit display panel; and
    a light guider disposed between two adjacent organic electroluminescent devices along an edge of each voxel and guiding light emitted from the two adjacent organic electroluminescent devices to uniformly transmit the light to the at least one surface of the plurality of voxels and the polymer dispersed liquid crystal display device.

2. The volumetric type three-dimensional display device according to claim 1, wherein the organic electroluminescent device includes;
    a substrate where a plurality of sub pixels are defined,
    a first electrode on the substrate,
    an organic layer on the first electrode and emitting light toward one surface of the voxel,
    a second electrode on the organic layer, and
    a protective film on the second electrode and the organic layer emits light toward one surface of the plurality of voxels.

3. The volumetric type three-dimensional display device according to claim 2, wherein the substrate and the protective film are formed of a transparent material.

4. The volumetric type three-dimensional display device according to claim 2, wherein each sub pixel includes a red sub pixel which emits red light, a green sub pixel which emits green light, and a blue sub pixel which emits blue light.

5. The volumetric type three-dimensional display device according to claim 4, wherein each sub pixel further includes a transmitting unit disposed in the red, green, and blue sub pixels.

6. The volumetric type three-dimensional display device according to claim 4, wherein each sub pixel further includes a transmitting unit in addition to the red, green, and blue sub pixels.

7. The volumetric type three-dimensional display device according to claim 2, further comprising:
    a cover which blocks a side located outside the plurality of voxels, wherein the side is one of sides of the organic electroluminescent device.

8. The volumetric type three-dimensional display device according to claim 7, further comprising:
a window located in the plurality of voxels and covering a side of the organic electroluminescent device which is not blocked by the cover.

9. The volumetric type three-dimensional display device according to claim 8, further comprising:
a moisture absorbent disposed between the window and the organic electroluminescent device.

10. The volumetric type three-dimensional display device according to claim 1, wherein the polymer dispersed liquid crystal display device includes:
a first substrate and a second substrate which are bonded to face each other;
a first electrode and a second electrode disposed in the first substrate and the second substrate, respectively; and
a polymer dispersed liquid crystal layer disposed between the first electrode and the second electrode.

11. The volumetric type three-dimensional display device according to claim 10, wherein the first and second substrates are formed of a transparent film.

12. The volumetric type three-dimensional display device according to claim 10, wherein the first and second electrodes are transparent and are applied with a voltage from first and second transparent wiring lines.

13. The volumetric type three-dimensional display device according to claim 1, further comprising:
a transparent cover wrapping an outer side of the three-dimensional shape.

14. The volumetric type three-dimensional display device according to claim 1, wherein the three-dimensional shape is one of a tetrahedron shape, a hexahedron shape, an octahedron shape, a dodecahedron shape, and an icosahedron shape.

15. The volumetric type three-dimensional display device according to claim 1, further comprising,
a matching unit extracting a voxel corresponding to a coordinate value of an object and matching the coordinate value of the object and a pixel value of the extracted voxel, and
a control unit selecting a voxel corresponding to the coordinate value of the object, extracts the pixel value of the voxel corresponding to the coordinate value of the object, and driving the organic electroluminescent device of the selected voxel to represent colors and gray scales corresponding to the extracted pixel value,
wherein the control unit blocks light from an unselected voxel using the polymer dispersed liquid crystal display device of the selected voxel.

16. A volumetric type three-dimensional display device comprising:
a plurality of voxels having a polyhedron shape and laminated three-dimensionally to form a three dimensional shape, wherein each of the plurality of voxels represents a full spectrum of colors and gray scales and surfaces of adjacent voxels are directly in contact with one another;
a polymer dispersed liquid crystal display device disposed on at least one surface of the polyhedron shape except for the surfaces of the adjacent voxels;
an organic electroluminescent device disposed on at least one corner of the polyhedron shape constituting a unit display panel;
a matching unit extracting a voxel corresponding to a coordinate value of an object and matching the coordinate value of the object and a pixel value of the extracted voxel;
a control unit selecting a voxel corresponding to the coordinate value of the object, extracting the pixel value of the voxel corresponding to the coordinate value of the object, and driving the organic electroluminescent device of the selected voxel to represent colors and gray scales corresponding to the extracted pixel value; and
a light guider disposed between two adjacent organic electroluminescent devices along an edge of each voxel and guiding light emitted from the two adjacent organic electroluminescent devices to uniformly transmit the light to the at least one surface of the plurality of voxels and the polymer dispersed liquid crystal display device.

17. The volumetric type three-dimensional display device according to claim 16, wherein the control unit blocks light from an unselected voxel using the polymer dispersed liquid crystal display device of the selected voxel.

18. The volumetric type three-dimensional display device according to claim 16, further comprising a transparent cover wrapping an outer side of the three-dimensional shape.

19. The volumetric type three-dimensional display device according to claim 16, wherein the organic electroluminescent device includes;
a substrate where a plurality of sub pixels are defined,
a first electrode on the substrate,
an organic layer on the first electrode and emitting light toward one surface of the voxel,
a second electrode on the organic layer, and
a protective film on the second electrode and the organic layer emits light toward one surface of the plurality of voxels.

20. The volumetric type three-dimensional display device according to claim 19, further comprising a cover blocking a side located outside the plurality of voxels, wherein the side is one of sides of the organic electroluminescent device.

* * * * *